United States Patent [19]

Thakoor et al.

[11] Patent Number: 4,876,668
[45] Date of Patent: Oct. 24, 1989

[54] THIN FILM MEMORY MATRIX USING AMORPHOUS AND HIGH RESISTIVE LAYERS

[75] Inventors: Anilkumar P. Thakoor, Pasadena; John Lambe, Altadena; Alexander Moopen, Pasadena, all of Calif.

[73] Assignee: California Institute of Technology, Pasadena, Calif.

[21] Appl. No.: 857,076

[22] Filed: Apr. 29, 1986

Related U.S. Application Data

[63] Continuation-in-part of Ser. No. 761,185, Jul. 31, 1985, abandoned.

[51] Int. Cl.[4] .............................................. G11C 13/00
[52] U.S. Cl. .......................................... 365/163; 357/2
[58] Field of Search ................. 365/163, 113; 357/2, 357/41, 45

[56] References Cited

U.S. PATENT DOCUMENTS

| | | | |
|---|---|---|---|
| 3,271,591 | 9/1966 | Ovshinsky | 365/163 |
| 3,846,767 | 11/1974 | Cohen | 365/163 |
| 4,660,166 | 4/1987 | Hopfield | 364/807 |
| 4,677,742 | 7/1987 | Johnson | 365/163 |
| 4,684,972 | 8/1987 | Owen et al. | 357/2 |

OTHER PUBLICATIONS

American Institute of Physics Conference Proceedings —vol. 151; pp. 315–320.
American Institute of Physics Conference Proceedings vol. 151; pp. 426–431.
J. Vac. Sci. Technol. A5 (4) Jul./Aug., 1987 pp. 1407–1411.

*Primary Examiner*—James W. Moffitt
*Attorney, Agent, or Firm*—Freilich, Hornbaker, Rosen & Fernandez

[57] ABSTRACT

Memory cells in a matrix are provided by a thin film of amorphous semiconductor material overlayed by a thin film of resistive material. An array of parallel conductors on one side perpendicular to an array of parallel conductors on the other side enable the amorphous semiconductor material to be switched in addressed areas to be switched from a high resistance state to a low resistance state with a predetermined level of electrical energy applied through selected conductors, and thereafter to be read out with a lower level of electrical energy. Each cell may be fabricated in the channel of an MIS field-effect transistor with a separate common gate over each section to enable the memory matrix to be selectively blanked in sections during storing or reading out of data. This allows for time sharing of addressing circuitry for storing and reading out data in a synaptic network, which may be under control of a microprocessor.

12 Claims, 6 Drawing Sheets

\_________________________________/
MATRIX T

FIG. 8

THIN FILM MEMORY MATRIX USING AMORPHOUS AND HIGH RESISTIVE LAYERS

ORIGIN OF INVENTION

The invention described herein was made in the performance of work under a NASA contract, and is subject to the provision of Public Law 96-517 (35 USC 202) in which the Contractor has elected to retain title.

BACKGROUND OF THE INVENTION

The present application is a continuation in part of the copending application Ser. No. 761,185 filed July 31, 1985, now abandoned.

This invention relates to a thin film random access memory matrix and a method for correcting elementary retrieval errors in the form of phantom vectors stored as an incidence of storing the desired vectors, and more particularly to an ultra high density memory formed from "nonvolatile" memory elements having a normally high resistance state until a data bit is stored therein, and a low resistance state (three or more orders of magnitude lower) once a data bit is stored.

A "nonvolatile" memory is a static memory in which data stored therein is retained until erased, and does not require electrical power to retain the stored information in memory. Such a memory would be very useful in systems requiring a very large amount of data to be randomly accessed. One system requiring such a memory is disclosed by John J. Hopfield in a patent application filed Jan. 22, 1985, Ser. No. 06/693,479, now U.S. Pat. No. 4,660,166 titled ELECTRONIC NETWORK FOR COLLECTIVE DECISION BASED ON LARGE NUMBER OF CONNECTIONS BETWEEN SIGNALS. That patent discloses a memory matrix used to implement a synaptic network. An embodiment of the present invention that may be adapted to the implementation of a network of synapses is disclosed herein.

SUMMARY OF THE INVENTION

In accordance with this invention, a memory cell having a contact dimension on the order of one micron is fabricated in a thin film of amorphous semiconductive material overlayed by a thin film of resistive material. The amorphous semiconductive material is subjected to electrical energy of ~1 nanojoule per cubic micron through the cell contacts to switch it from an OFF (high resistance) state to an ON (low resistance) state of three or more orders of magnitude lower resistance. The electrical power applied may then be removed, and the memory cell will retain its lower resistance state. Thereafter, to read out the bit of data stored therein, a predetermined level of voltage is applied to the contacts, and the level of current conducted through it is sensed.

The thin film of resistive material overlaying the memory cell stabilizes the current flow through the cell during readout for more reliable operation, particularly in a high density memory matrix comprised of a thin film of amorphous semiconductive material and an array of parallel conductive strips on each side, with one array of parallel conductive strips perpendicular to the other to define a memory cell at every point where two strips cross. One array of conductive strips may be produced on a nonconductive substrate before depositing the thin film of amorphous semiconductor material. The second array of conductive strips is then produced on the overlaying resistive film.

In operation of a very large memory, it would be advantageous to provide some means of blanking selected sections, or blanking all but a selected section. Such a means may be provided by fabricating at each cell a vertical metal-insulator-semiconductor (MIS) field-effect transistor (FET), i.e., an MISFET having the channel perpendicular to the substrate. Amorphous semiconductor material in the channels of all MISFETs in a block or section is subjected to the requisite electrical voltage to open all the channels in that section to conduction. This is accomplished by producing, on the film of amorphous semiconductive material, vertical strips of an amorphous seiconductor material (with somewhat different properties) perpendicular to the lower array of conductive strips. The upper array of conductive strips are provided in ohmic contact with the upper edge of the vertical strips of amorphous semiconductor material. Next an insulating layer is deposited over all of this structure, and finally a thin film of metal is deposited on the insulating layer to produce a gate adjacent each vertical strip of amorphous semiconductor material, thus providing an array of vertical MISFETs for the memory cells with a common gate for all the MISFETS. The source electrodes of all cells in a column are provided by a common conductive strip, and all the drain electrodes of all cells in a row are provided by a common conductive strip.

Once all MISFETs are enabled by a gate voltage, the selection of one column conductive strip and one row conductive strip allows reading out, or storing, a bit in the cell where the strips intersect. The vertical strips of amorphous semiconductive material, which constitute the FET channels, provide the function of a resistive layer to stabilize the current flow through the cells. For that purpose, the composition of the vertical amorphous strip may differ from the film of amorphous material deposited over the lower array of conductive strips. The electric field at the area where the conductive strips cross is sufficient to effect the change from the OFF to the ON state of the material in that defined area. An array of memory cell is utilized in a synaptic network having nonlinear active devices driving an input array of parallel coductors with positive feedback from respective conductors of the output array, and a negative feedback threshold inhibit signal to each active device derived from the sum of the currents from the output arrays of conductors.

An electronic embodiment of a neural network memory, in which the synaptic network takes the form of a binary connection matrix with dilute vector coding in the auto-associative mode, may have memory retrieval errors in the form of phantom vectors stored as an incidence of storing the desired vectors. A limited number of these phantom vectors can be eliminated by providing additional asymmetric connections to the memory matrix formed by making resistive connections at the rows, i, and columns, j, of the sum of binary vector product matrices $$\sum_{s=1}^{R} V_i^s V_j^s$$

where $R$ is the number of stored vectors $V^s$. After analysis, to determine the presence of phantom vectors in the network memory, each phantom vector is eliminated by superimposing, i.e., storing, an additional binary matrix, that is the product of each phantom vector $V^p$ and the nearest correct vector $V^2$. Upon addressing the memory with fewer than all of the bits of the nearby vector $V^s$, the memory will stabilize on that vector, rather than on the phantom vector. The result is an error free storage with a storage efficiency of ~25% for binary matrices in a megabit size memory.

The novel features that are considered characteristic of this invention are set forth with particularity in the appended claims. The invention will best be understood from the following description when read in connection with the accompanying drawings.

DESCRIPTION OF PREFERRED EMBODIMENTS

It is well known that many materials in thin film form can be switched from a high to a low resistance state. [S. R. Ovshinsky, "Reversible Electrical Switching Phenomena in Disordered Structures," Phys. Rev. Lett., Vol. 21, 1450 (1968); S. R. Ovshinsky and H. Fritzche, "Amorphous Semiconductors for Switching, Memory, and Imaging Applications," IEEE Trans. Electron. Dev., Vol. 20, 91 (1973); and A. E. Owen and J. M. Robertson, "Electronic Conduction and Switching in Chalcogenide Glasses," IEEE Trans. Electron. Dev., Vol. 20, 104 (1972)] The nature of the switching mechanism may be that of dielectric breakdown, electrochemical doping, or thermal recrystallization. In the latter two, the switching process may be reversible. Howevere, in considering suitable thin film materials for the "memory connections," one must carefully examine the writing energy and writing speed requirements, possible limitations on the maximum reversible energy to a connection, stability of the "OFF" and "ON" states, as well as their reproducibility and reliability.

Among various oxides, polymers, and semiconductors, hydrogenated amorphous silicon represents a good switchable material. Switching in the a—Si:H films is irreversible; they exhibit excellent reproducibility, high OFF/ON resistance ratio ($\sim 10^5$), and require very low writing energy ($\sim 10^{-9}$ Joule per cubic micron). Consequently, such material is preferred for the present invention, although in the broadest aspects of the invention it is not required.

Figure 1:
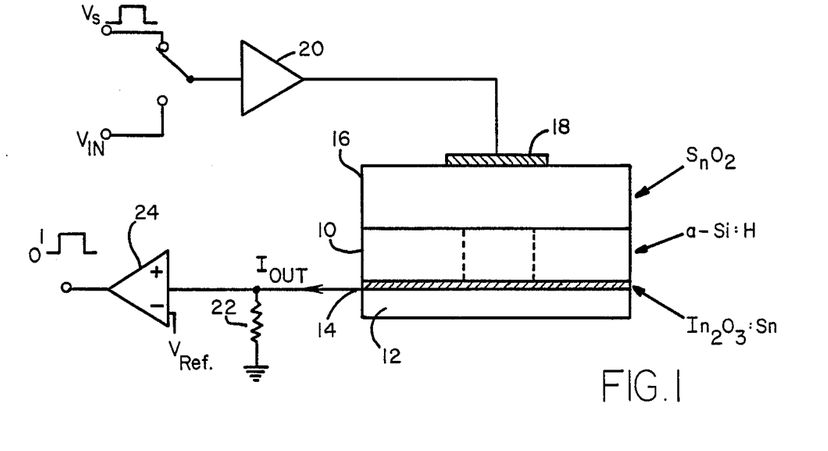
FIG. 1 is a schematic diagram in elevation of a memory cell produced in accordance with this invention.

Referring now to FIG. 1, a thin film memory cell is formed of a high resistivity film 10 of amorphous semiconductor material, preferably hydrogenated silicon (a—Si:H) or hydrogenated germanium, although other materials having similar characteristics may be used. The film 10 is deposited on a nonconductive substrate 12 first coated with a thin film 14 of conductive material, such as indium tin oxide ($In_2O_3$:Sn). A film 16 of high resistive material, such as tin oxide ($SnO_2$) is deposited over the amorphous semiconductor material. To complete the cell, a metal contact 18 is deposited over the resistive layer.

To store a bit of data, a pulse signal of suitable amplitude is applied to an amplifier 20 which produces a voltage pulse that drives electrical energy through the high resistive film 16 and the amorphous semiconductor film 10 to switch the amorphous material in the film 10 from a high to a low resistance state in the current path between the electrode 18 and the conductive film 14. In the case of a—Si:H material of 0.2 $\mu$m thickness and a contact area of 1 $\mu m^2$, the resistance is switched from $\sim 2 \times 10^9$ ohms to $\sim 2 \times 10^4$ ohms by an energy pulse of 1.0 nanojoule, which can be produced by a pulse from the amplifier 20 of 10 volts peak at $10^{-5}$ amps for 10 $\mu$sec in response to a signal $V_s$.

The data bit stored in the cell may thereafter be read by applying a suitable signal $V_{in}$ to the amplifier 20 to produce a fixed voltage, such as 3 V, applied to the cell contact 18. The higher current level through the switch material is sensed as an output signal $I_{out}$. Shown in FIG. 1 is a load resistor 22 connected to the lower contact 14 to produce an output voltage $V_{out}$ at the input of a threshold amplifier 24. The output of that amplifier is either at a predetermined high level indicative of a bit 1, or a low level indicative of a bit 0, depending upon the level of the voltage developed across the resistor 22 relative to a reference $V_{Ref}$.

Figure 2:
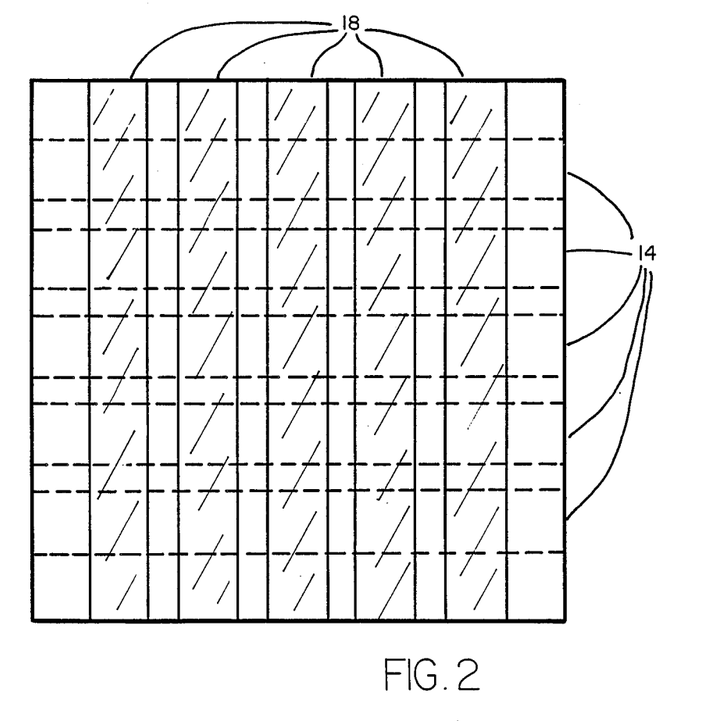
FIG. 2 is a plan view of a 5×5 array of memory cells produced in accordance with the teachings of FIG. 1

A matrix of memory cells may be produced by depositing the films 10 and 16 over an array of parallel conductors 14 that are ~1 $\mu$m wide and 0.1 $\mu$m thick. Then a second array of parallel conductors 18 of the same dimensions are deposited on top. FIG. 2 illustrates a 5×5 array where the upper conductors 18 are shown vertical, and the lower conductors 14 are shown horizontal in dotted lines.

These are various other methods by which the cell can be switched, depending on the switching material. One general method is by electron or laser beam writing. In a matrix of cells, selective switching is accomplished with a scanning electron or laser beam following the deposition of the film 10 on the first set of conductors. An an example, if amorphous silicon is used for the film 10 as the switching material, then a low resistance path through a selected cell area is formed after thermal recyrstallization induced by localized heating with the electron or laser beam and subsequent cooling. Thereafter the memory array structure is completed. The main disadvantage with this method is that the programming of the cells must be performed during the fabrication of the matrix. A more practical approach is to program the necessary energy pulse between the appropriate pair of horizontal and vertical conductors of the matrix after it is completed to selectively switch the material at the intersections. This is the basis of the programmable writing described with reference to FIG. 1. However, this method imposes more stringent requirements on the switching properties of the material in terms of breakdown characteristics and writing energy.

In addition to the material requirements, there is one important question that needs to be addressed before an effective memory can be built. This relates to the problem of "cross talk" between memory cells during the read process, and the write process as well, if the programmable electrical energy pulse method is used to store data bits in the memory cells. This problem effectively limits the packing density of the switches, and sets the minimal quality of the electronics required for signal processing. However, using hydrogenated silicon (a—Si:H) as the switching material for the film 10, the OFF state is $10^5$ times higher than the ON state, and the resistivity of the material is $10^6$ ohm-cm. Consequently, the rows and columns of cells may be spaced with as little as 0.5 µm between them, i.e., the 1.0 µm conductive strips may be on 1.5 µm centers, thus providing an ultra high density memory. Since read out is accomplished through a film 16 of large resistance, with current limited thereby, several cells can be read out in close proximity at the same time without excessive cross talk. The current limiting action relaxes the current handling requirement of the readout circuitry to a practical level. Similarly, while storing data, several cells in close proximity can be switched in parallel without excessive heat dissipation requirements, although it would also be feasible to store one bit at a time in sequence and thus avoid any heating problem altogether.

Figure 3:
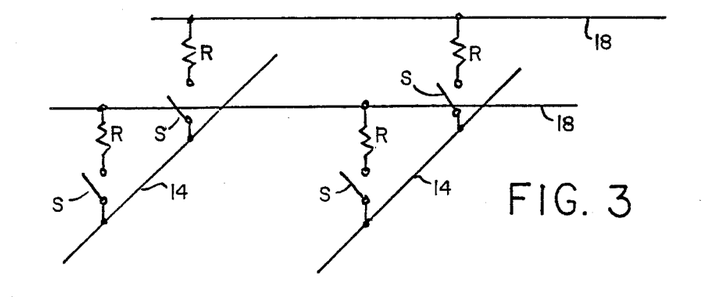
FIG. 3 is a schematic diagram of the electrical equivalence of a portion of the array of FIG. 2
Figure 4:
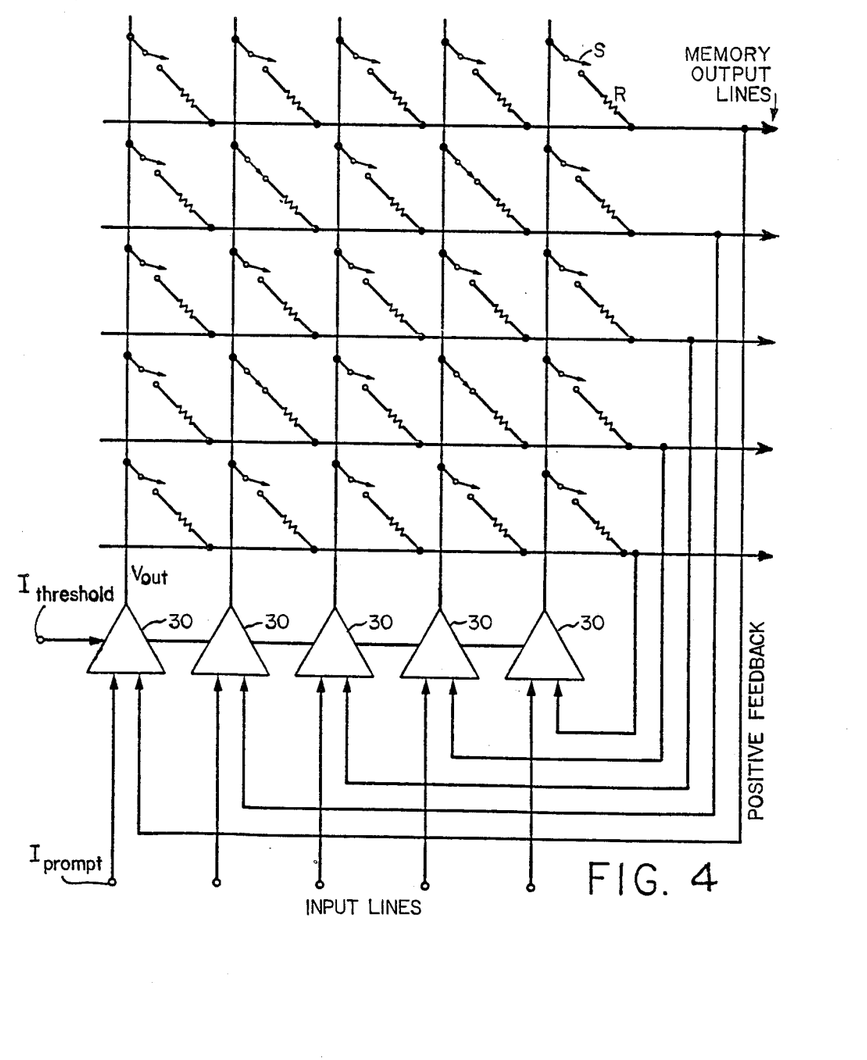
FIG. 4 illustrates the utilization of an array as shown in FIG. 2 in a synaptic network for a content addressable memory.

FIG. 3 illustrates schematically a 4×4 portion of the matrix of FIG. 2. At each intersection between a lower conductor 14 and a upper conductor 18 there is defined a memory cell, which in its unswitched (OFF) state is represented by an open switch S and a resistor R, and in its switched (ON) state is represented by a closed switch S and a resistor R. A 5×5 array is illustrated more schematically in FIG. 4 by showing the conductors in a two-dimensional plane with the cell switches and resistors across corners of the intersecting (but unconnected) vertical and horizontal conductors. FIG. 4 shows the 5×5 matrix of FIG. 2 utilized to implement the network of synapses which forms the basis for the system of John J. Hopfield referred to hereinbefore.

The term "network of synapses" is derived from the concepts of information storage and retrieval that have been hypothesized for such functions in the brain. In terms of any electronic embodiments, the neuron of the brain is viewed as a thresholding, nonlinear amplifier, while the synapses become the simple resistive feedback elements into which data bits are stored. Such networks behave as associative or content addressable memories with the unusual ability to recall memorize patterns, given only some fragments of the patterns. In addition, such memories are distributive, i.e., no single bit of information is localized in its use. This property gives a natural fault tolerance to such structures. From the point of view of dense information storage, one notes that a memory cell is only a passive feedback element with no active element involved in the storage function. The active elements are only used to read out information upon being cued. As the memory cells in the network are passive two-terminal resistive elements, they can be extremely small in size. Such a synaptic network thus offers a potential of ultra high storage density, approaching $10^9$ bits per square centimeter. The operational principles of synaptic networks and their application potential as high density, content addressable memories will be discussed briefly with reference to FIG. 4.

In an idealized electronic system based on the neural network model, an active device (neuron) implemented with a nonlinear active device 30, such as an operational amplifier, has a property of sensing an input current (or voltage) and outputting two possible values of voltage depending on the input. An array of N such devices 30 is connected together through a two dimensional wiring matrix (N×N) with various values of resistors at each node. Such a system is shown schematically in FIG. 4. The values of the resistors determine what information is stored; the active elements are used to "address" or evoke the stored information based on prompting cues applied to some of the active devices.

The characteristics of an ideal nonlinear active device 30 is that of a simple threshold amplifier that has a low output and steps to a high output when the input exceeds a threshold level. Each of the nonlinear active devices 30 thus compares its input current to a pedetermined threshold. If it is greater than the threshold, its output is "high;" if it is less than the threshold, its output is low (zero). The setting of this threshold is equivalent to an "inhibition" level in a neural sense, and the source of negative feedback in an electronic sense. The interaction of positive feedback from the resistor matrix with this negative feedback (inhibition) leads the circuit to a "stable state," which thus corresponds to a piece (e.g., a word) of information stored in the interconnection matrix. A number of such words can be stored in the same matrix, either independently or associatively, by making more connections. The "limits" to the umber of stored words in terms of connection usage and retrieval errors are discussed below. With appropriate prompting, individual words can be retrieved as distinct stable states, that is, each nonlinear active device 30, will output "0" or "1", and this output assemblage will correspond to a given recalled state.

Suppose the information is coded in the form of binary vectors, or words, and that R such words ($V^s$, s=1, ..., R), each with N components $V_i$=1 or 0, are to be memorized. In terms of the binary connection strengths, ($T_{ij}$=1 or 0), the matrix which will give the desired memory behavior is described by the following storage algorithm:

$$T_{ij} = 1, \text{ if } \sum_{S=1}^{R} V_i^s V_j^s \geq 1 \qquad (1)$$

$$T_{ij} = 0, \text{ if } \sum_{S=1}^{R} V_i^s V_j^s = 0 \qquad (2)$$

The term $V_i^s V_j^s$ is the auto-correlation product of a vector $V^s$, and it yields a particularly simple and important form of the matrix memory which stores a number of such vector matrices, each matrix being superimposed on the others in the sense that if a bit 1 is already in a particular position (i, j) because of other matrices already stored, the condition of a bit 1 in that position for the next vector to be stored is satisfied. This superposition of auto-correlation product matrices, i.e., the storage of $$\sum_{S=1}^{R} V_i^s V_j^s$$

in one memory matrix will occasionally create phantom vectors, as will be noted more fully hereinbefore.

Figure 5:
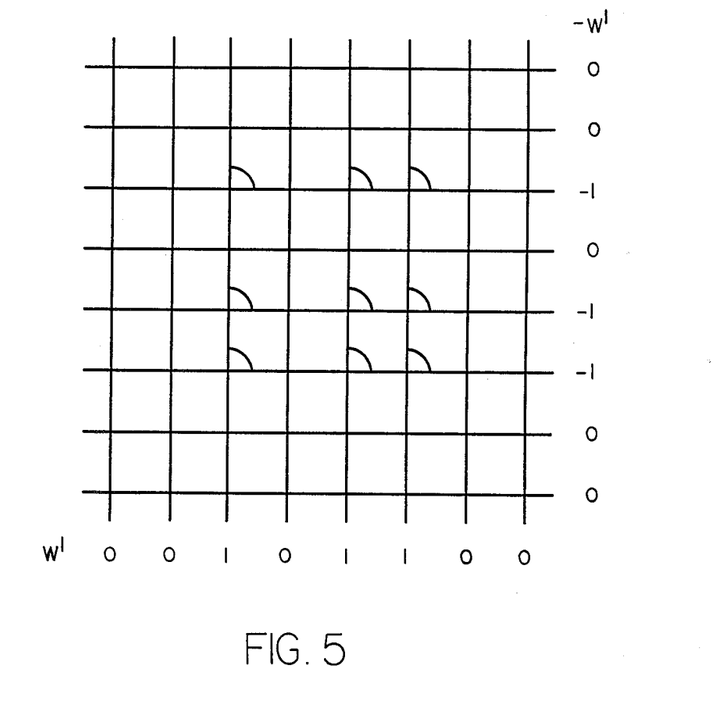
FIG. 5 is a block diagram of a system utilizing the content synaptic network of FIG. 2.

To better understand the auto-correlation product term which is central to neural network memories, we will show a simple example of the storage algorithm. Consider the storage of a simple word V' with N=5. Let V'=01011. The appropriate connection scheme given by the algorithm of Eqs. (1) and (2) is shown in FIG. 5. Note that the auto-correlation product matrix is symmetric. The evaluation of the autocorrelation product term can be represented schematically as an auto-correlation product stored in the following way: apply the word V' to the vertical "input" lines and the negative or "mirror image" of V' to the corresponding horizontal "output" lines, one then forms a connection only at the intersections where there is a difference in signal level of two units between the vertical and horizontal lines. The memory network is built up as the corresponding signals for each word to be stored are applied to the vertical and horizontal lines and the appropriate connections are made. Attention is directed to the fact that there will always be some connections aligned on the diagonal of the memory matrix (upper left to lower right corner in FIG. 8), and there will always be symmetry in all other connections on opposite sides of the diagonal. This is because the vector $V^s$ is being multiplied by itself to form the auto-correlation product stored as a matrix of connections.

Each auto-correlation product is generated by a direct application of matrix algebra, wherein one vector, $V^s$, is multiplied by its transposed vector $[V^s]^T$, to produce an N×N product matrix. Reference to the negative or "mirror image" is only for the purpose of producing a signal of two units where the matrix conductors are impressed with signals of one unit for a bit 1 representation, thereby storing a bit 1, and signals of zero units for a bit 0. In practice, one could instead form the auto-correlation product matrix of each vector $V^s$ to be stored and then, after superimposing each such matrix on all prior product matrices, storing the resulting sum of vector product matrices in a memory network.

In addition to the positive feedback inherent in the memory network of FIG. 4, it is necessary to add a negative feedback (an inhibition level) in order to attain stability in the system as mentioned earlier. A simple form of inhibition can be introduced by the negative feedback term $$I_{threshold} = -\alpha \sum_{i=1}^{N} V_i,$$

where $\alpha$ is a gain factor. This has the effect of limiting the number of devices that can be ON at a given time since the negative feedback signal grows with the number of active devices or "neurons" with a "high" output. This forms of dynamic thresholding provides the system the ability to respond to memory cues.

In order to store information efficiently into a binary matrix memory, some kind of dilute vector coding is necessary. This is apparent when one considers the storing of a binary vector with a minimum vector srength (i.e., all components are "ones"). The role of dilute vector coding has been examined extensively by D. J. Willshaw, et al., "Non-Holographic Associative Memory," Nature, Vol. 222, 960 (1969); D. J. Willshaw, "Models of Distributed Associated Memory," Thesis, Univ. of Edinburgh (1971); are more recently by G. Palm, "On Associative Memory," Biol. Cybernetics, Vol. 36, 19 (1980). It was found that by limiting th vector strength, M, i.e., the number of "ones" in a binary vector or word, to a small fraction of N, high information storage capacity could be achieved at low retrieval error rate. For example, at the optimum vector strength, $M(opt)=\log_2 N$, the amount of information that can be stored in an N×N binary matrix memory (in the limit of very large N) approaches $\ln 2 \times N^2$ bits, or $\sim 69\%$ of the theoretical maximum possible in the case of a nonsymmetric binary matrix memory, and $0.5 N^2 \times \ln 2$ bits or $\sim 35\%$ for an auto-associate binary product matrix memory.

Of particular interest is the question of just how strongly do the storage capacity and error rate depend on vector coding, especially near the optimum conditiosn. To examine this, assume that $M<<N$, then the information stored (bits) per word is approximately $M \log_2 N$. It turns out best to use about half of the connections, then the probability Pc that a switch is closed is $\frac{1}{2}$. For a "proper" output, the minimum requirement is that a vector $V^s$ when inputted will produce an output $\sim MV^s$, and that this vector $MV^s$ can be thresholded against unwanted outputs. Now, the probability of a single output error can be approximated by $Pc^M$ so that the mean number of errors per word would be $\sim (N-M)Pc^M$. Then with $Pc=\frac{1}{2}$ and $M=\log_2 N$, one can store $0.69\ N^2$ bits of information with probability one of a single bit error per word.

Since the number of connections made for each word is $\sim M^2 = (\log_2 N)^2$ and the information stored per word is $M \log_2 N = (\log N)^2$, one stores an average of one bit per connection. This corresponds to the optimum results noted earlier. If one now doubles the vector strength by setting $M=2\log_2 N$, then information is stored at the rate of $$\frac{2 \log_2 N \times \log_2 N}{(2 \log_2 N)^2} = \frac{1}{2} \text{ bit per connection.}$$

The storage capacity is less, $\sim \frac{1}{2} \times 0.69\ N^2$ bits, but the error rate is reduced to 1/N bit error per word so that for N stored words, one word would have a single bit error.

The above observations clearly show the strong dependence of storage capacity and error rate on how dilute the vectors are coded. Another question that naturally arises is whether matrix memories can operate without errors with reasonable storage capacity. One can certainly conceive of an error free memory by incorporating some kind of error correction to take care of severe vector overlap.

Figure 8:
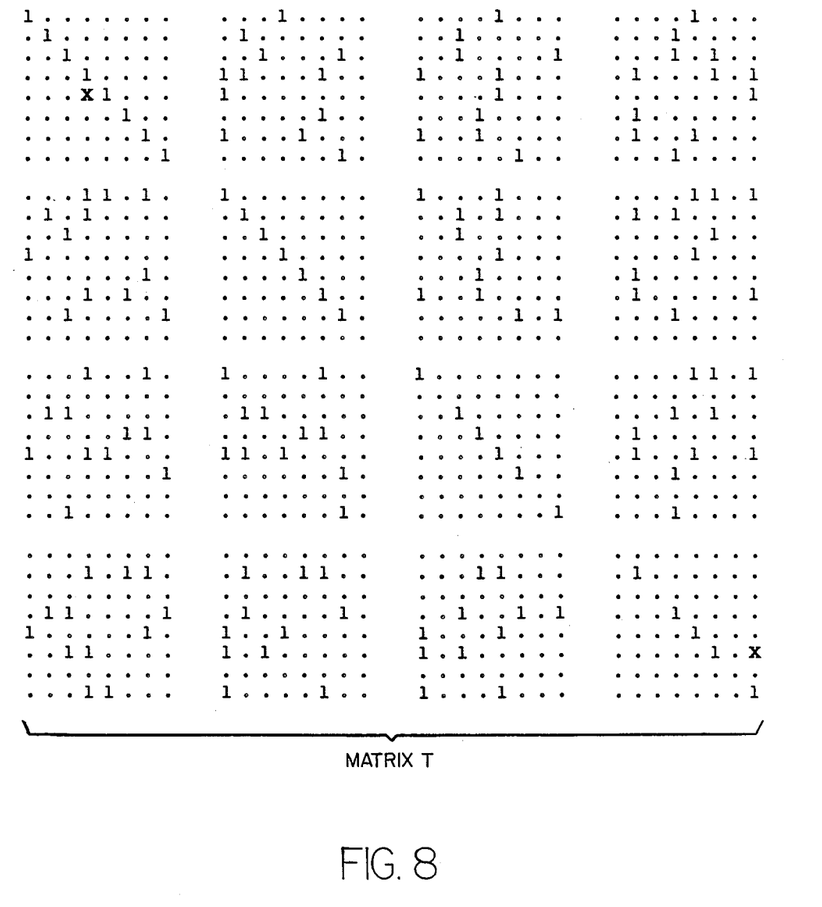
FIG. 8 illustrates a 32×32 bit matrix with stored vectors which produce phantom vectors on addressing the memory, and the correction of the errors by inserting a bit 1 represented by an X for each phantom vector that may be produced.

The dilute binary coding described above has a special property that the retrieval errors due to the appearance of spurious "ones" are intrinsically suppressed in an auto-vector product matrix memory. This coding scheme is based on the idea of local inhibition which dictates that when one component of a binary vector takes the value "one," some of the other components of the vector must take the value "zero," One simple form of local inhibition consists of decomposing the vector into a certain number of groups, such as four groups of eight bits per group in a 32×32 bit memory, in which only one component of each group may have the value "one." A stored vector may take the form of four octal numbers, such as 1455, wherein the value of each number stored in a group of eight bits is represented by its position in its assigned group of eight bit positions. In the example of 1455, the first group stores a bit 1 in position one, the second group stores a bit 1 in position four, and the third and fourth groups store a bit 1 in position five. If all the input vectors are coded in this form, as illustrated in FIG. 8, they would have the same vector strength equaling the number of groups. Although the use of local inhibition leads to a slight reduction in the information content per vector, this is more than compensated not only by the elimination of spurious "ones" but also the ease with which information may be encoded in such a dilute binary form.

The information storage capacity of a binary matrix memory incorporating a local inhibition is still limited by another type of retrieval errors, namely the appearance of false memories (phantom states). These memories, like the spurious "ones" appearing in a distorted memory, arise as a result of the overlap among the originally prescribed vectors product matrices. In a general sense, if the memory matrix is considered as a logic machine, the false memories may have a more important role as a set of additional logical statements which are consistent with the originally described statements. However, as a content-addressable memory of coded vectors, the false memories produce phantom vectors that should be suppressed.

It is possible to suppress the phantom vectors by means of an additional error-correction matrix. However, a more elegant approach which avoids the addition of such a matrix is to introduce a slight asymmetry into the memory matrix itself. The basic idea is to add the necessary connections to the memory matrix so that each phantom vector $V^P$ is mapped onto its nearby stored vector $V^s$ by storing the auto-correlation vector product $V^P V^S$. This will now be described heuristically with reference to FIG. 8 where each node of a memory matrix is represented by a bit at the intersections of rows and columns. Following that.

The twelve vectors stored in FIG. 8 by the connections represented by bit 13 s are as follows:

| STORED VECTORS: | | | | |
|---|---|---|---|---|
| (1455) | (4116) | (3336) | (2234) | (8764) |
| (4252) | (7542) | (4618) | (5158) | (7115) |
| (3784) | (6642) | | | |

It will be shown that the phantom vectors present due to overlap of stored auto-correlation product matrices are as follows:

PHANTOM VECTORS

| (4118) | (4158) |
|---|---|

To correct the error, i.e., eliminate the phantom vectors from the memory network, the phantom vectors are mapped unto their nearest stored vectors. The mapping of a phantom vector $V^P$ onto the nearest stored vector means simply to store a vector product matrix of the phantom vector $V^P$ (once it has been identified by analysis) with the nearest prescribed vector $V^s$, as follows for the example illustrated in FIG. 8.

| $V^P$ | | $V^s$ |
|---|---|---|
| (4118) | → | (4116) |
| (4158) | → | (5158) |

If local inhibition is strictly enforced, the phantom vectors would no longer be "eigenvectors" of the pseudo-eigensystem. Moreover, since the phantom vectors are usually single-bit errors for small memory loadings, the new connections needed for the mappings are among those unused connections located in the diagonal blocks of the memory matrix T shown in FIG. 8.

The use of asymmetric connections to suppress phantom vectors has been demonstrated in the electronic binary matrix memory shown in FIG. 8. This approach works well provided the number of phantom vectors $V^P$ is small (<10% of the number of prescribed vecrors $V_s$). The extent to which it is well suited for suppressing larger number of phantom vectors needs to be examined further since the extra connections themselves could give rise to new phantom vectors.

Consider the idealized system consisting of a setof N thresholding nonlinear amplifiers. The setting of the threshold current $I^{Th}$ of the $i^{th}$ amplifier is equivalent to an "inhibition" level in a neural sense, and is a source of negative feedback in an electronic sense. Although various forms of inhibition are possible, we consider one simple form which is well suited to the local inhibition scheme for dilute coding as described earlier. In our electronic implementation, each amplifier is assigned to a group and the amplifiers in each group have a common threshold determined only by the output of the amplifiers belonging to the same group. In addition, it is required that only one amplifier in a group can be in the high output state at any give time. For an appropriate choice of the connections of matrix T, the interaction of the amplifiers through the positive feedback from the connections of the matrix and the negative feedback (inhibition) leads to a set of "stable states" of the system. Thus, information, when represented as binary vectors, may be "stored" in the system as prescribed stable states, and evoked or retrieved as distinct stable states from appropriate memory cues.

Let $V^s$, $=1, \ldots, R$ be a set of R binary vectors which is to form the memories of the system. The connection of the matrix T which would best render these vectors as stable states of the system is described by the storage algorithm given in Eqs. (1) and (2). FIG. 8 shows an example of false state destablization as demonstrated in the programmable 32×32 matrix memory system. The twelve prescribed vectors listed hereinbefore assumed a specific form which was compatible with the local inhibition scheme. Each vector, of vector strength four, is described by four octal numbers, each specifying which of the eight components in a group takes the value "1". In the matrix shown in FIG. 8, there are phantom vectors: (4118) and (4158). These were "mapped" to their respective nearest prescribed vectors (4116) and (5158), as that term has been defined hereinbefore.

The new connection matrix which incorporates the additional mappings differs from the original matrix by the appearance of two new connections: one in the $T_{1,1}$ diagonal block resulting from the (4118)→(4116) mapping and another in the $T_{4,4}$ block from the (4158)→(5158) mapping. The effective destabilization of the phantom vectors was determined by applying various prompts to the memory system and observing the system's final state when the prompt was removed. Phantom vectors never appeared at the output terminals as final stable states. In fact, when a phantom vector was evoked as an intermediate state, it always converged to the prescribed memory it was mapped to, upon the removal of the prompt. The correction of the error produced by a phantom vector occurs because the symmetry for that phantom vector is so destroyed that the memory is not stable for that phantom vector; instead the memory stabilizes on a correct vector, thus assuring correct operation of the memory. This technique is not a burden in a diluted memory, i.e., in a memory where less than 50% of the memory capacity is used.

This technique of suppressing false memories was successfully demonstrated in an electronic binary matrix memory arranged just as described with reference to FIG. 5, but expanded to a 32×32 matrix illustrated schematically in FIG. 8. The prescribed vectors assumed a specific form which was compatible with the local inhibition scheme. Each vector, of vector strength four, was described by four numbers, each specifying which of the eight components in a group would take the value "1". One such set of twelve randomly chosen vectors set forth hereinbefore was stored just as shown in FIG. 8.

In Hopfield's theoretical studies of the collective behavior of neural networks, (J. Hopfield, et al., "Neural Computation of Decision in Optimization Problems," in press, Biological Cybernetics (1985), and J. Hopfield, "Neural Networks and Physical Systems with Emergent Collective Computational Abilities," Proc. Natl., Acad. Sci., Vol. 79, 2554 (1982)) he has shown that for a symmetic network ($T_{ij}=T_{ji}$), the memory always converges to a stable state for any set of input cues or prompts. Moreover, the stable states correspond to the local minima of the following quantity which may be referred to as the "energy function" of the system:

$$E = -\frac{1}{2} \sum_{i=1}^{N} \sum_{j=1}^{N} T_{ij}V_iV_j - \sum_{i=1}^{N} V_iI_i \quad (3)$$

where $I_i$ and $V_i$ are the external input currents and the output voltages of the ith amplifier. In the high amplifier-gain limit, the minima are located at the corners of the N-dimensional hypercube defined by $V_i=0$ or 1. For a binary matrix memory system where $T_{ij}$ is either 0 or 1, the double sum is always positive, thus E is at the absolute minimum when $V_i=1$ (assuming there is no external stimulus, i.e, $I_i=0$). This is what would be expected since there is no negative feedback in the system. To described a system incorporating global inhibition, the term $$2C \left( \sum_i V_i \right)^2$$

with $C>0$, should be added to the energy function. The energy function now becomes:

$$\begin{aligned} E &= -\frac{1}{2} \sum_{i=1}^{N} \sum_{j=1}^{N} T_{ij}V_iV_j + \frac{1}{2}C \left( \sum_{i=1}^{N} V_i \right)^2 - \sum_{i=1}^{N} V_iI_i \\ &= -\frac{1}{2} \sum_{i=1}^{N} \sum_{j=1}^{N} (T_{ij} - C) V_iV_j - \sum_{i=1}^{N} V_iI_i \end{aligned} \quad (4)$$

The study of the dynamics of the network memories is of particular importance since it provides much insight to the recall capability of the memory in terms of memory cycling time and ability to respond to incomplete and/or incorrect memory cues or prompts. To investigate their dynamical behavior, a hardware simulation study has been performed using a programmable binary switch memory system constructed from discrete electronic components. The system consisted by a 32×32 memory matrix, a set of 32 active devices ("neurons"), and a memory prompting circuit.

A schematic diagram of the basic system is the same as for the 5×5 matrix shown in FIG. 4, but expanded from 5×5 to 32×32. The switches in series with the resistors are CMOS analog switches controlled by a set of serial-in/parallel-out shift registers connected in cascade. Programming of the switches (i.e., $T_{ij}$'s) is accomplished by sending a serial stream of the appropriate data bits to the shift registers from a computer. The bits stored in the shift register set the CMOS switches on wherever there are binary ones, thus simulating a memory cell, albeit a volatile memory cell in the sense that if power is momentarily interrupted, all of the stored data is lost, as contrasted to the nonvolatile memory of the present invention.

The active devices are nonlinear amplifiers each consisting of a current summing amplifier followed by a high-gain differential amplifier functioning as a comparator. Together they provide the desired thresholding characteristic referred to hereinbefore. A global inhibit signal is applied to the comparator input of the amplifiers to provide the necessary negative feedback for stability. Note that the negative feedback corresponds to the second term of Eq. 4 and thus always gives a positive contribution to the energy function.

A set of pseudo-random binary vectors were generated and stored in the memory matrix. The network indeed exhibited the predetermined stable states (corresponding to the stored vectors) under the full dynamic thresholding and feedback conditions, provided the stored vectors did not overlap each other considerably, in which case the error correcting technique described could have been used. Thus, prompting the memory with a "cue" of one or more of the stored octal vector numbers would produce the complete vector at the memory output. When the overlapping of the cues was severe, some of the stored vectors did not correspond to unique stable states, indicating the presence of phantom vectors. When these overlapping cues are used as memory prompts, the memory converges to stable states "nearest" these words in Hamming distance.

Analysis for detection of phantom vectors can be made, for the purpose of using the correction technique described above, either after the prescribed vectors are stored or, preferably, after the auto-correlation product matrices are formed and summed, but before they are stored. The phantom vectors found can then be mapped to their nearest prescribed vectors by producing the vector product $V^P V^s$, and adding the matrices to (superimposed on) those to be stored. Then when the matrices are stored at one time, the corrections are also entered in memory. The analysis of the auto-vector product matrices formed and summed is carried out by systematically checking to see if all possible cue combinations of each vector, such as 14——, —45—, ——55, 145—, —455, will evoke a vector not prescribed, i.e., evoke a vector not present in the list of twelve used to form the sum of matrices stored as shown in FIG. 8.

The convergent properties of the memory were further investigated by examining the memory responses to fewer than all bits of the words stored and incorrect prompts. It was observed that at the optimum inhibit gain, a minimum prompt vector strength of two (i.e., two "ones") was needed to evoke a stored word; otherwise the memory settled to the stable null state ($V_i$'s=0). When the prompt was "ambiguous," i.e., the prompt could not uniquely determine a stored vector, the memory converged to a stable state consistent with the prompt. That the memory tends to favor one stable state over others is attributed to slight variations in active device characteristics and component values, and to parasitic capacitance in the circuitry. With an incorrect prompt, the memory generally converged to the nearest stable state if the prompt contained more "correct ones" than "incorrect ones;" otherwise it resumed the null state. It was also observed that the level of fault-tolerance of the memory to incorrect prompt was dependent on the prompt strength, i.e., the magnitude of the prompt current to the inputs of the amplifiers.

TABLE 1

| Binary Code | Prompt | Memory Output |
|---|---|---|
| 01001000 11000000 00110000 10000100 | J _ _ _ | JANE |
| Of Stored Name | _ _ N _ | JANE |
| JANE | _ A N N | (NS) |
|  | J O N E | JANE |
| 01001000 00101000 01100000 00110000 | J _ _ _ | JANE |
| Of Stored Name | _ O _ _ | JOHN |
| JOHN | J O N _ | JOHN |
|  | A O N N | JOHN |
| 11000000 10001000 11000000 01000001 | A _ _ _ | (FS) |
| Of Stored Name | _ D _ _ | (FS) |
| ADAM | _ _ A _ | ADAM |
|  | _ D O M | (NS) |
|  | J O A M | ADAM |
| 01000001 11000000 00100001 00001001 | M _ _ _ | MARY |
| Of Stored Name | _ A _ _ | JANE |
| MARY | _ _ R _ | MARY |
|  | _ O R Y | MARY |
|  | G A N Y | MARY |
| 10000001 01000010 10000100 00110000 | G _ _ _ | GLEN |
| Of Stored Name | _ _ _ N | GLEN |
| GLEN | G O E _ | GLEN |
|  | A L E N | GLEN |
|  | J A E N | (FS) |

FS = False State
NS = Null State

The memory cycle time (the time required for the memory to evoke a stored vector when a minimum prompt is applied) was measured to be approximately 15 microseconds. The cycle time was generally found to be insensitive to the vector strength of the stored vectors or to whether the applied prompt was ambiguous, but was primarily limited by circuit capacitance and the speed of the operational amplifiers used in the active devices. The information content of a 32-bit long binary word with vector strength five is approximately 17 bits; thus, with a cycle time of 15 microseconds, the data retrieval rate is of the order of one megabit per second. The cycle time can be reduced by an order of magnitude using faster devices and improved circuit design, so that for a 1000×1000 matrix memory (which would most likely be fabricated in the thin film form described above), data retrieval rate of the order of a gigabyte per second could be achieved.

As we have seen thus far, a memory matrix based on the neural network model would have many desirable features. Among such features are ultra-high density, content addressability, and fault tolerance. An immediate potential of such a matrix would be in the area of large scale information storage without mechanical devices. More significantly, such devices would offer a new approach to ultra-high density information storage and information processing for future generation computers. In particular, new applications which could take full advantage of the device's content addressing and fault tolerant capabilities, would include pattern recognition, computation for process optimization, fast access knowledge base for artificial intelligence and expert system.

In the implementation of a synaptic network, a very high density memory may be fabricated as described with reference to FIGS. 1 and 2, but it is necessary to use nonlinear active devices as shown in FIG. 4 to prompt and read the information stored, one device per input line, with feedback as shown in the figure. It can therefore be readily appreciated that even with a modest memory array of 1000×1000, there is a problem in accommodating 1000 devices on a chip because they require significantly more area as compared to the basic memory cells, and thus a significantly overhead expense and limitation on usable bit density. Each line could be extended to a very long length, so as to reduce the proportion of devices to memory elements, but this can cause problems in reading the data because of practical limitations on device output power and coding for writing and reading data. A memory that could take advantage of the unique performance capabilities of the system and basic elements could become so large and unwieldy as to become extremely difficult in design and operation. If the memory were broken into smaller sections, writing and reading would be simplified and more easily controlled. If these sections of memory could also share devices, a great deal of chip space could be saved, and costs per bit of memory reduced.

The solution of this problem is a blanking gate, i.e., a gate structure that will overlie and control an entire section of memory, and to connect the devices to matrix conductive strips that run through a plurality of such sections, whereby any section may be selected for operation with the devices by blanking all others.

Figure 6:
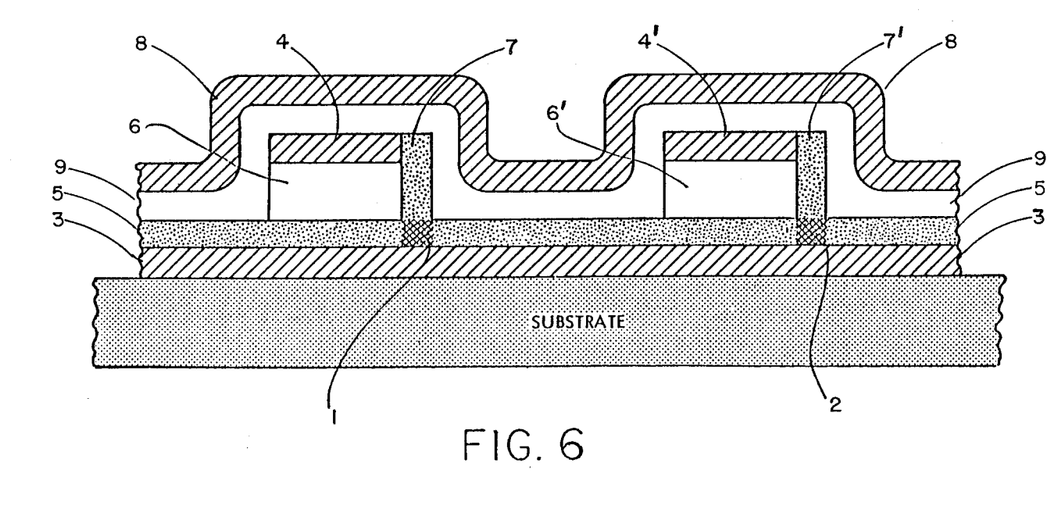
FIG. 6 is a sectional view of two memory cells in a row utilizing MIS field-effect transistors with a common gate for implementing an array of memory cells with a separate common gate over each of a plurality of sections to allow gating off selected sections.

FIG. 6 is a cross-sectional view of one blanket gate over two memory cells comprised of switched resistor areas 1 and 2. As noted with reference to FIG. 1, the switched resistor areas lie between the crossings of two matrix (conductive strips) running at right angles to each other in parallel planes. The two sets of conductive strips shown in FIG. 6 are deposited conductors labeled 3 and 4, for the lefthand memory cell, and 3 and 4' for the right-hand memory cell. However, unlike the memory cell of FIG. 1, the greater areas of the amorphous semiconductor material 5 lying directly under the upper conductors 4 and 4' are not switched to the ON state because of insulating material 6 and 6'; instead the switching takes place only under vertically oriented contact strips 7 and 7' which are also formed of an amorphous semiconductor material along the lengths of upper wires 4 and 4'. This material may differ from the material in the film 5. The switched resistor areas 1 and 2 under the strips 7 and 7' are shown cross-hatched in the drawing. The vertical strips 7 and 7' replace the current limiting resistance film of FIG. 1. Its cross-sectional area (length and width) are chosen to suit the requirements of both defining the contact area over the amorphous semiconductor film 5 and the current limiting resistance film. Although this geometry is appreciably different, its function is exactly as disclosed with reference to FIG. 1. Thus, when sufficient voltage appears between any strip 7, or 7' and strip 3 due to a voltage applied between a conductive strip 4 or 4', and strip 3, and switched resistor area 1 or 2 will permanently change to a lower resistance state, thereby storing a data bit.

The action of strips 7 and 7' is controlled by a common gate 8 in the manner of an insulated gate field-effect transistor. Application of the proper voltage on gate conductor 8 depletes the carriers in strips 7 and 7' such that they cannot conduct in response to write pulses fed to them by wires 4 or 4', thus preventing the storage of a data bit. The function of the common gate 8 is the same during memory readout operation. While the gate is held at this voltage, interrogation prompt pulses cannot read the state of the switching resistors 1 and 2 in the thin film 5, thus effectively blocking any readout. In that manner, a memory section can be selected for storing data or reading out data. Since the gate is common to all the FET cells in an entire section of memory, the entire section can be blanked out by one gate control signal.

During fabrication, the lower array of parallel conductors 3 is deposited, followed by the amorphous semiconductor layer 5. An array of parallel supporting insulators 6 and 6' is next deposited using conventional masking and deposition techniques. Conductors 4 and 4' are then deposited on the insulators 6 and 6' followed by the edge-on evaporation deposition of strips 7 and 7' of amorphous semiconductor material. In this way, fine lithography is not needed because there is a beam like evaporative technique capable of precisely building up the strip height on the side of the insulator strips 6. An insulating layer 9 is next deposited over the entire structure, over which the common gate 8 is deposited. A final layer of protective insulation (not shown) is then deposited. For a more complete understanding of the construction and operation of a vertical field-effect transistor see Nobumitsu Hirose, et al., "Two-Dimensional Numerical Analysis of Amorphous-Silicon Field-Effect Transistors," Japanese Journal of Applied Physics, Vol. 24, No. 2, February, 1985, pp 200-207.

In a content addressable memory, each section may be associated with a class or subclass of content. Thus, to extend the example given above, one section could be dedicated to storage of names that begin with the letter "J." Data on those names is written in this section. In prompting and reading, since one group of devices is connected to long lines running through all sections, only one section is enabled at a time. When searching for data on names that begin with the letter "J," a controlling and dedicated microprocessor will sent out the proper signal to enable the J section. Thus, it is not necessary to hunt through all the sections as long as the general class of information sought is known. The specific information is found by the prompting and reading process applied to the other section that is enabled by a signal applied to its blanking gate.

Although this memory matrix with a blanking gate is not as dense as that disclosed with reference to FIGS. 1 and 2, much as the area of chip surface dedicated to devices is eliminated. This results in a substantial reduction in total chip area of the entire memory system, and ease in design, coding and operation for larger memories.

Figure 7:
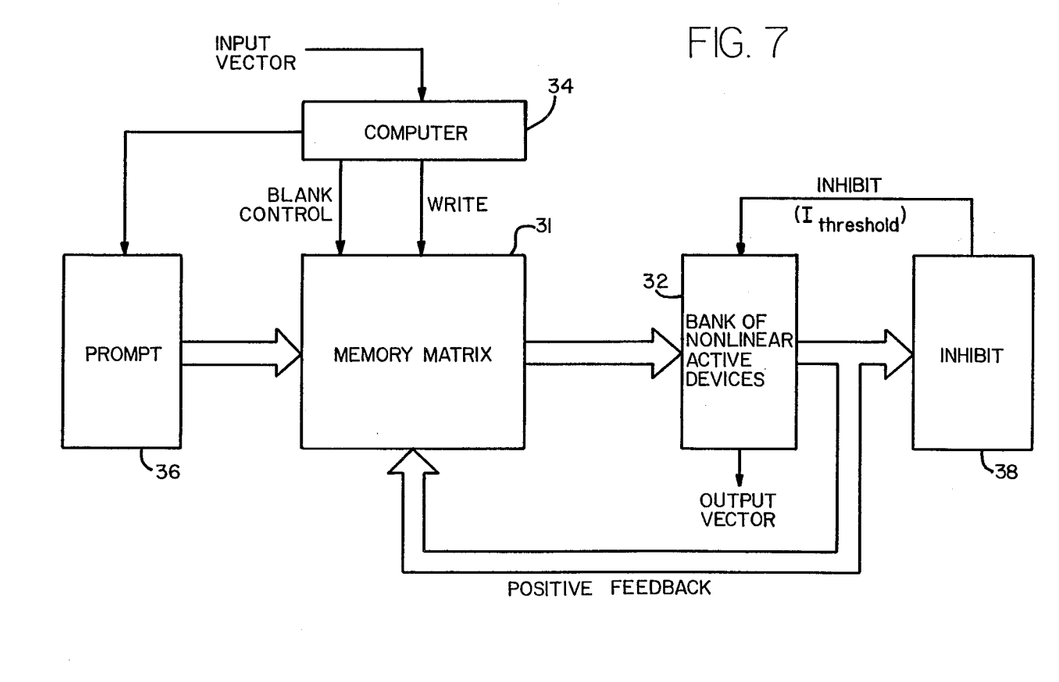
FIG. 7 illustrates the organization of a system utilizing the memory matrix shown in FIG. 4 to implement a content addressable memory.

A system utilizing a thin film memory in a synaptic network is shown in FIG. 7. A high density memory matrix 31 fabricated as described with reference to FIGS. 1 and 2 is provided with a bank 32 of nonlinear active devices. By utilizing the blanking gate described with reference to FIG. 6, the memory may be provided with fewer devices in implementing a synaptic network described with reference to FIG. 4. A computer 34 encodes the data to be stored and, while selecting sections of the memory through blanking control, stores the data, either one bit at a time or one word at a time. Thereafter, while selecting an appropriate section of the memory, prompt signals are generated by a bank of prompt amplifiers 36 under direction of the computer 34 to retrieve data from the memory using whatever prompts are available as to the data desired. The output, which is taken from the feedback path of the synaptic network, is read into the computer where it is used and/or displayed. A summing circuit 38 with a gain of $-\alpha$ provides an inhibit signal ($I_{threshold}$) to the bank 32 of nonlinear active devices.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. A matrix of nonvolatile memory cells for storing bits of data comprised of a thin film of amorphous semiconductor material overlayed by a thin film of resistive material, a plurality of parallel ohmic contact strips on the surface of said resistive material opposite said amorphous semiconductor material, a plurality of parallel ohmic contact strips on the surface of said semiconductor material opposite said resistive material and perpendicular to said contact strips on said thin film of resistive material, and means for applying a pulse of electrical energy through said thin film of amorphous semiconductor material and said overlying resistive material through said contacts, said pulse being sufficient voltage to switch said amorphous semiconductor material from a high state to a low state of resistance, and for thereafter applying a pulse of electrical current sufficient to sense the state of said semiconductor material.

2. A nonvolatile memory cell as defined in claim 1 wherein said amorphous semiconductor material is comprised of hydrogenated semiconductor material.

3. A nonvolatile memory cell as defined in claim 2 wherein said hydrogenated semiconductor material is hydrogenated silicon.

4. A nonvolatile memory cell as defined in claim 1 wherein said thin film of resistive material is comprised of tin oxide.

5. An array of memory cells comprised of a substrate of nonconductive material, a first array of parallel conductors deposited on said substrate, a thin film of amorphous semiconductor material deposited on said substrate over all said first array of conductors, a thin film of resistive material deposited over all said thin film of amophous semiconductor material, a second array of parallel conductors deposited on said thin film of resistive material, said second array of conductors being oriented perpendicular to said first array of conductors, whereby an electrical store pulse may be applied through selected conductors of said first and second arrays to said amorphous semiconductor material at the intersection of said selected conductors, said store pulse being of sufficient energy to swtich said amorphous semiconductor material to a low resistance state, and thereafter an electrical read pluse of lower energy than said store pulse, and sufficient to switch said amorphous material to a low resistance state, may be applied through said selected conductors and said amorphous semiconductor material in series with said thin film of resistive material to determine the state of said amorphous semiconductor material.

6. An array of memory cells as defined by claim 5 wherein said amorphous semiconductor material is comprised of hydrogenated semiconductor material.

7. An array of memory cells as defined in claim 6 wherein said hydrogenated amorphous semiconductor material is hydrogenated silicon.

8. A nonvolatile memory cell as defined in claim 5 wherein said thin film of resistive material is comprised of tin oxide.

9. An array of memory cells comprised of a substrate of nonconductive material,
  a first array of parallel conductors deposited on said substrate,
  a thin film of amorphous semiconductor material deposited on said substrate over all said first array of conductors,
  a thin film of resistive material deposited over all said thin film of amorphous semiconductor material,
  a second array of parallel conductors deposited on said thin film of resistive material, said second array of conductors being oriented perpendicular to said first array of conductors,
  whereby an electrical store pulse may be applied through selected conductors of said first and second arrays to said amorphous semiconductor material at the intersection of said selected conductors, said store pulse being of sufficient energy to switch said amorphous semiconductor material to a low resistance state, and thereafter an electrical read pulse or lower energy than said store pulse, and sufficient to switch said amorphous material to a low resistance state, may be applied through said selected conductors and said amorphous semiconductor material in series with said thin film of resistive material to determine the state of said amorphous semiconductor material, and
  including an array of nonlinear active devices, one for each of said conductors of said first array, said devices each providing an input terminal for selectively energizing the conductor connected thereto for reading out data and a set of positive feedback connections from respective ones of said conductors of said second array constituting memory output lines,
  and further including a thresold inhibit feedback input proportional to the sum of all the currents in said second array of conductors derived from said first array of conductors selectively energized to each of said nonlinear active devices, thereby providing a synaptic network.

10. An array of memory cells comprised of
  a substrate of nonconductive material,
  a first array of parallel conductors deposited on said substrate,
  a thin film of amorphous semiconductor material deposited on said substrate over said first array of conductors,
  an array of parallel strips of insulating material perpendicular to said first array of conductors,
  a strip of conductive material over each strip of insulating material to provide a second array of conductors,
  a film of amorphous semiconductor material deposited on said thin film of amorphous material along the edge of each strip of insulating material and strip of conductive material to provide a current path of predetermined resistance to said thin film of amorphous material deposited on said substrate over said first array of conductors,
  a layer of insulating material over the entire structure thus produced on said thin film deposited on said substrate over said first array of conductors, and
  a layer of conductive material deposited over said layer of insulating material in sections corresponding to preselected memory blocks so as to delineate them,
  whereby an MIS field-effect transistor is formed at each intersection of a conductive strip of said second array with a conductive strip of said first array for selectively gating off all memory cells in selected memory sections.

11. A memory system having
  a memory matrix comprised of a substrate of nonconductive material,
  a first array of parallel conductors deposited on said substrate,
  a thin film of amorphous semiconductor material deposited on said substrate over said first array of conductors,
  a thin film of resistive material deposited over said thin film of amorphous semiconductor material,
  a second array of parallel conductors deposited on said thin film of resistive material, said second array of conductors being oriented perpendicular to said first array of conductors,
  means for encoding data to be stored in said memory matrix and for selectively applying a pulse of electrical energy though said thin film of amorphous semiconductor material and said overlaying resistive material through said contacts, said energy being sufficient to switch said amorphous semiconductor material from a high state to a low state of resistance in response to each code bit,
  an array of nonlinear active devices, one for each of said conductors of said second array, said devices each having an input terminal for selectively energizing the conductor connected thereto for reading out data, and a positive feedback input from a separate conductor of said first array, thereby providing a synaptic network, and
  means for applying prompt codes to inputs of said array of nonlinear active devices for reading out stored data that most nearly corresponds to the prompt codes, whereby data read out is presented at output terminals of said array of devices.

12. A memory system having
  a memory matrix comprised of a substrate of nonconductive material,
  a first array of parallel conductors deposited on said substrate,
  a thin film of amorphous semiconductor material deposited on said substrate over said first array of conductors,
  an array of parallel strips of insulating material perpendicular to said first array of conductors, a strip of conductive material over each strip of insulating material to provide a second array of conductors, a film of amorphous semiconductor material deposited on said thin film of amorphous material along the edge of each strip of insulating material and strip of conductive material to provide a current path of predetermined resistance of said film of amorphous material deposited on said substrate over said first array of conductors, a layer of insulating material over the entire structure thus produced on said thin film deposited on said substrate over said first array of conductors, and a layer of conductive material deposited over said layer of insulating material in sections, whereby an MIS field-effect transistor is formed at each intersection of a conductive strip of said second array with a conductive strip of said first array for selectively gatting off all memory cells in sections, means for encoding data to be stored in said memory matrix and for selectively applying a pulse of electrical energy through said thin film of amorphous semiconductor material and said overlaying resistive material through said contacts, said energy being sufficient to switch said amorphous semiconductor material from a high state to a low state of resistance in response to each code bit, an array of nonlinar active devices, one for each of said conductors of said second array, said devices each having an input terminal for selectively energizing the conductor connected thereto for reading out data, and a positive feedback input from a separate conductor of said first array, thereby providing a synaptic network, means for selectively enabling sections of said MIS field-effect transistors for storing or reading out data, and means for applying prompt codes to inputs of said array of nonlinear active devices for reading out stored data that most nearly corresponds to the prompt codes, whereby data read out is presented at output terminals of said array of devices.

* * * * *